(12) United States Patent
Chang et al.

(10) Patent No.: US 10,535,530 B2
(45) Date of Patent: Jan. 14, 2020

(54) PATTERNING METHOD

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Ying-Chih Lin, Tainan (TW); Gang-Yi Lin, Taitung County (TW)

(73) Assignees: UNITED MICROELECTRONICS CORP., Hsin-Chu (TW); Fujian Jinhua Integrated Circuit Co., Ltd., Quanzhou, Fujinan Province (CN)

(*) Notice: Subject to any disclaimer, the term of this patent is extended or adjusted under 35 U.S.C. 154(b) by 0 days.

(21) Appl. No.: 16/167,435

(22) Filed: Oct. 22, 2018

(65) Prior Publication Data

US 2019/0181014 A1 Jun. 13, 2019

(30) Foreign Application Priority Data

Dec. 13, 2017 (CN) .......................... 2017 1 1326148

(51) Int. Cl.
*H01L 21/308* (2006.01)
*H01L 21/033* (2006.01)
*H01L 21/8234* (2006.01)

(52) U.S. Cl.
CPC ...... *H01L 21/3086* (2013.01); *H01L 21/0337* (2013.01); *H01L 21/823468* (2013.01)

(58) Field of Classification Search
None
See application file for complete search history.

(56) References Cited

U.S. PATENT DOCUMENTS

| 6,492,073 | B1 | 12/2002 | Lin |
| 6,571,384 | B2 | 5/2003 | Shin |
| 7,429,536 | B2 | 9/2008 | Abatchev |
| 7,691,549 | B1 | 4/2010 | Glasser |
| 9,741,614 | B1* | 8/2017 | Kuo ................. H01L 21/31144 |
| 9,941,164 | B1* | 4/2018 | Kim ................. H01L 21/76897 |
| 2005/0250330 | A1 | 11/2005 | Chen |
| 2011/0159691 | A1* | 6/2011 | Shih .................... H01L 21/0337 438/689 |
| 2018/0040713 | A1* | 2/2018 | Chang ............. H01L 21/823431 |
| 2019/0013201 | A1* | 1/2019 | Chang ............. H01L 27/10855 |

* cited by examiner

*Primary Examiner* — Shamim Ahmed
(74) *Attorney, Agent, or Firm* — Winston Hsu

(57) ABSTRACT

A patterning method for forming a semiconductor device is disclosed. A substrate having a hard mask disposed thereon is provided. A first patterned layer is formed on the hard mask layer. A first self-aligned double patterning process based on the first patterned layer is performed to pattern the hard mask layer into a first array pattern and a first peripheral pattern. After that, a second patterned layer is formed on the substrate. A second self-aligned double patterning process based on the second patterned layer is performed to pattern the first array pattern into a second array pattern. Subsequently, a third patterned layer is formed on the substrate. An etching process using the third patterned mask layer as an etching mask is performed to etch the first peripheral pattern thereby patterning the first peripheral pattern into a second peripheral pattern.

18 Claims, 15 Drawing Sheets

PATTERNING METHOD

BACKGROUND OF THE INVENTION

1. Field of the Invention

The present invention generally relates to the field of semiconductor manufacturing. More particularly, the present invention relates to a patterning method for forming integrated circuit features of a semiconductor device with improved manufacturability.

2. Description of the Prior Art

In semiconductor manufacturing, the integrated circuits of a semiconductor device are formed by firstly decomposing the design of the integrated circuits into multiple design layers and then converting each design layer into a layer of actual integrated circuit features by performing patterning processes to construct the integrated circuits. A typical patterning process, such as a photolithography-etching process usually includes transferring patterns of each design layer from a photomask to a material layer, such as a photoresist layer on a semiconductor substrate to form a patterned mask layer, and then using the patterned mask layer as an etching mask to etch the semiconductor substrate thereby transferring the patterns of the design layer to the semiconductor substrate. However, as increasing demands for a better device performance and a higher degree of integration, the dimensions of integrated circuit features of the semiconductor device continue to shrink and the manufacturing of the semiconductor device has become more and more difficult. The fidelity of the patterning processes to accurately transfer the patterns of the design layer to the semiconductor substrate has become a major bottleneck in advanced semiconductor manufacturing. The situation is more challenging when different types of dense patterns are incorporated in a same design layer. Therefore, a patterning method with improved fidelity and manufacturability is still under intensive development in the semiconductor industry.

SUMMARY OF THE INVENTION

One objective of the present invention is to provide a method for forming integrated circuit features of a semiconductor device. The method provided by the present invention is particularly suitable for forming a semiconductor device comprising different types of dense patterns in a same design layer with simplified process steps and improved fidelity and manufacturability.

To achieve the aforesaid objective, one embodiment of the present invention provides a patterning method including the following steps. First, a substrate comprising an array region and a peripheral region defined thereon is provided. A hard mask layer is then formed on the substrate and completely covering the array region and the peripheral region. Subsequently, a first patterned layer is formed on the substrate to partially cover the hard mask layer in the array region and the partially cover the hard mask layer in the peripheral region. After that, a first self-aligned double patterning (SADP) process based on the first patterned layer is performed to pattern the hard mask layer in the array region into a first array pattern and the hard mask layer in the peripheral region into a first peripheral pattern. Following, a second patterned layer is formed on the substrate and partially covers of the first array pattern and completely covers the first peripheral pattern. A second self-aligned double patterning process based on the second patterned layer is then performed to pattern the first array pattern into a second array pattern. Subsequently, a third patterned layer is formed on the substrate and partially covers the first peripheral pattern and completely covers the second array pattern. Thereafter, an etching process using the third patterned mask layer as an etching mask is performed to etch the first peripheral pattern thereby patterning the first peripheral pattern into a second peripheral pattern.

According to an embodiment, a target layer and a pattern transferring layer on the target layer are formed between the substrate and the hard mask layer. After forming the second array pattern and the second peripheral pattern, an etching process using the second array pattern and the second peripheral pattern as an etching mask is performed to concurrently transfer the patterns of the second array pattern and the second peripheral pattern to the pattern transferring layer. After that, using the patterned pattern transferring layer as an etching mask to etch the target layer, the patterns of the second array pattern and the second peripheral pattern are transferred to the target layer, thereby forming a patterned target layer comprising ideal array circuit features in the array region and ideal peripheral circuit features in the peripheral region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles.

FIG. 1 to FIG. 15 are schematic diagrams illustrating the steps of a patterning method for forming a semiconductor device according to one embodiment of the invention, in which:

FIG. 1 illustrates a top view and a cross-sectional diagram of the semiconductor device after forming a first patterned layer on a substrate;

FIG. 2 to FIG. 6 sequentially illustrate top views and cross-sectional diagrams of the semiconductor device during a first self-aligned double patterning (SADP) process based on the first patterned layer to form a first array pattern and a first peripheral pattern;

FIG. 7 illustrates a top view and a cross-sectional diagram of the semiconductor device after forming a second patterned layer on the substrate after the step as shown in FIG. 6;

FIG. 8 to FIG. 11 sequentially illustrate top views and cross-sectional diagrams of the semiconductor device during performing a second self-aligned double patterning (SADP) process based on the second patterned layer to form a second array pattern;

FIG. 12 illustrates a top view and a cross-sectional diagram of the semiconductor device after forming a third patterned layer on the substrate after the step as shown in FIG. 11;

FIG. 13 illustrates a top view and a cross-sectional diagram of the semiconductor device after forming a second peripheral pattern by using the third patterned layer as an etching mask to etch the first peripheral pattern;

FIG. 14 illustrates a top view and a cross-sectional diagram of the semiconductor device after transferring the patterns of the second array pattern and the second peripheral pattern downwardly to a pattern transferring layer; and FIG. 15 illustrates a top view and a cross-sectional diagram of the semiconductor device after transferring the patterns of the second array pattern and the second peripheral pattern downwardly to a target layer.

DETAILED DESCRIPTION

Figure 1:
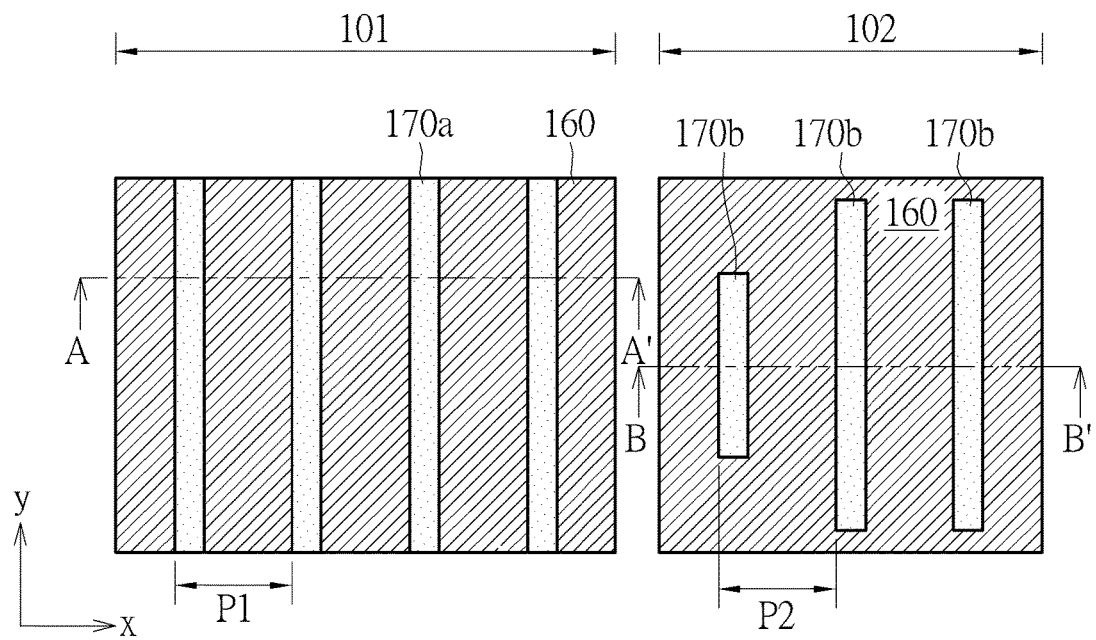
Figure 1:
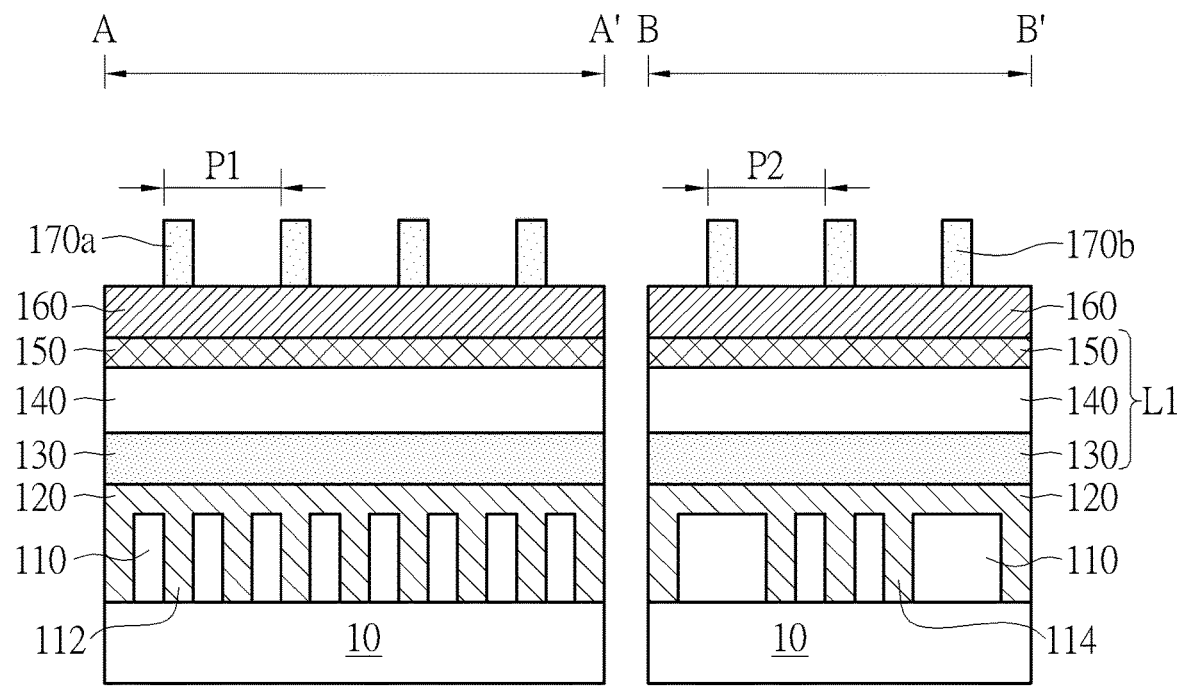

In the following detailed description, reference is made to the accompanying drawings which form a part hereof, and in which is shown, by way of illustration of specific embodiments in which the invention may be practiced. These embodiments are described in sufficient detail to enable those skilled in the art to practice the invention. Other embodiments may be utilized and that structural, logical and electrical changes may be made without departing from the spirit and scope of the present invention.

One or more implementations of the present invention will now be described with reference to the attached drawings, wherein like reference numerals are used to refer to like elements throughout, and wherein the illustrated structures are not necessarily drawn to scale.

The term "substrate" used herein include any structure having an exposed surface on which a layer is deposited according to the present invention to form the integrated circuit features. The term substrate is understood to include semiconductor wafers, but not limited thereto. The term substrate is also used to refer to a semiconductor construction during processing, and may include other layers that have been fabricated thereupon.

During the descriptions herein, various "regions" defined on the substrate in which the integrated circuit features are fabricated are mentioned. These regions may be used to designate areas having certain types of devices or materials. These regions may be used to conveniently describe areas that include similar devices and should not limit the scope or spirit of the described embodiments. It should be understood that these regions may exist anywhere on the substrate and that the regions may not be mutually exclusive. That is, in some embodiments, portions of one or more regions may overlap. Any number of regions may exist on the semiconductor substrate and should not limit the scope or spirit of the described embodiments.

The concept of "pitch" may be used to describe one aspect of the sizes of the features in an integrated circuit. Pitch is defined as the distance between identical points in two neighboring features, such as features in an array, which are typically arranged in a repeating pattern. As a result, pitch may be viewed as the sum of the width of a feature and of the width of the space on one side of the feature separating that feature from a neighboring feature.

The present invention pertains to a patterning method for integrally forming integrated circuit features having different types of dense patterns on a semiconductor substrate. In an exemplary embodiment, as will be described in more detail below, a patterning method for integrally forming the storage node (SN) pads in an array region and the contact plug pads in a peripheral region on a semiconductor substrate for forming a dynamic random access memory (DRAM) device is disclosed.

Please refer to FIG. 1 to FIG. 15, which sequentially illustrate a patterning method for forming a semiconductor device according to one embodiment of the invention. The upper portions of FIG. 1 to FIG. 15 are top views. The lower portion of FIG. 1 to FIG. 6 are cross-sectional views taken along line A-A' and line B-B' in the corresponding top views. The lower portion of FIG. 7 to FIG. 15 are cross-sectional views taken along line C-C' and line B-B' in the corresponding top views. As shown in the left portions of the top views of FIG. 1 to FIG. 15, line A-A' cuts through an array region 101 of the substrate 10 along a second direction X, and line C-C' cuts through the array region 101 of the substrate 10 along a first direction Y. In the following illustrated embodiment, the first direction Y and the second direction X are perpendicular. In other embodiments, the first direction Y and the second direction X may not be perpendicular and may have an included angle smaller than 90 degrees. As shown in the right portions of the top views of FIG. 1 to FIG. 15, line B-B' cuts through a peripheral region 102 of the substrate 10 along the second direction X. In other embodiments, line B-B' may cut through the peripheral region 102 of the substrate 10 along the first direction Y.

As shown in FIG. 1. A substrate 10 is provided. The substrate 10 may be a silicon substrate, an epitaxial silicon substrate, a silicon-germanium substrate, a silicon carbide substrate, or a silicon-on-insulator substrate, but not limited thereto. The substrate 10 may be used for forming a DRAM device. The substrate 10 may have an array region 101 and a peripheral region defined thereon. The array region 101 is wherein the memory cells to be formed. The peripheral region 102 is wherein the peripheral circuits to be formed. The substrate 10 may have semiconductor structures such as transistors, word-lines and bit-lines formed therein. For the sake of simplicity, the above-mentioned structures are not shown in the diagrams.

An interlayer dielectric layer 110 and a target layer 120 on the interlayer dielectric layer 110 are formed on the substrate 10. The material of the interlayer dielectric layer 110 may include silicon oxide or silicon nitride, but not limited thereto. A plurality of contact plugs may be formed in the dielectric layer 110. For example, the contact plugs 112 (also referred as storage node contacts, SNC) are formed in the interlayer dielectric layer 110 in the array region 101 for electrically connecting the capacitors (not shown) to terminals of the transistors of the memory cells of the DRAM device. The contact plugs 114 are formed in the interlayer dielectric layer 110 in the peripheral region 102 for electrically connecting the metal interconnections (not shown) to terminals of the transistors of the peripheral circuits of the DRAM device. The contact plugs 112 and the contact plugs 114 may comprise conductive material, such as aluminum, tungsten, copper, titanium-aluminum alloy or other low-resistance conductive materials, respectively. The target layer 120 is formed on the interlayer dielectric layer 110 in a blanket manner and completely covers the array region 101 and the peripheral region 102. The target layer 120 may be in direct contact with the contacts plugs 112 and the contact plugs 114. The target layer 120 may comprise conductive material, such as aluminum, tungsten, copper, titanium-aluminum alloy or other low-resistance conductive materials.

According to one embodiment, the contact plugs 112, the contact plugs 114 and the target layers 120 may be formed integrally and include a same conductive material. For example, after defining the openings for forming the contact plugs 112 and the contact plugs 114 in the interlayer dielectric layer 110, a conductive material is formed on the interlayer dielectric layer 110 in a blanket manner, completely covering the interlayer dielectric layer 110 in the array region 101 and in the peripheral region 102 and filling up the openings of the contact plugs 112 and the contact plugs 114. A planarization process is then carried out to planarize the conductive material, until a pre-determined thickness of the conductive material is remained on the interlayer dielectric layer 110 and has a planar top surface.

According to the embodiment, the target layer 120 on the top surface of the interlayer dielectric layer 110 in the array region 101 is used to form storage node contact (SNC) pads, which are the interconnecting structures between the contact plugs 112 and the capacitors of the DRAM device. The target layer 120 on the interlayer dielectric layer 110 in the peripheral region 102 is used to form contact plug pads (also referred to as M0 contacts), which are interconnecting structures between the contact plugs 114 and upper metal interconnections of the DRAM device. In the following description, an improved process provided by the present invention to pattern the target layer 120 in the array region 101 into storage node contact (SNC) pads and the target layer 120 in the peripheral region 102 into contact plug pads would be described in detail.

Please still refer to FIG. 1. After forming the target layer 120, a stacked film structure is formed on substrate 10 and completely covers the target layer 120. The stacked film structure may include a pattern transferring layer L1 and a hard mask layer 160 on the pattern transferring layer L1. According to an embodiment, the pattern transferring layer L1 may have a multi-layered structure, comprising (from bottom to top) a hard mask layer 130, an advanced patterning film (APF) 140 and an anti-reflection layer 150. The hard mask layer 130 may comprise silicon nitride. The APF 140 may comprise ashable amorphous carbon. The anti-reflection layer 150 may comprise silicon oxy-nitride (SiON). The hard mask layer 160 may comprise silicon oxide or polysilicon. Subsequently, a first patterned layer 170a/170b, including a first patterned layer 170a in the array region 101 and a first patterned layer 170b in the peripheral region 102, is formed on the hard mask layer 160. According to an embodiment, the first patterned layer 170a/170b may comprise a photoresist or an organic dielectric material. The first patterned layer 170a/170b may be formed by coating an organic dielectric layer (or a photoresist layer) on the hard mask layer 160 followed by performing a patterning process, such as a photolithography-etching process to concurrently pattern the organic dielectric layer into the first patterned layer 170a in the array region 101 and the first patterned layer 170b in the peripheral region 102. As shown in the top view of FIG. 1, the first patterned layer 170a in the array region 101 and the first patterned layer 170b in the peripheral region may respectively include a plurality of linear features that are straight-line shaped and extend along the first direction Y. The linear features of the first patterned layer 170a are arranged in parallel along the second direction X and are separated from each other by a first pitch P1. The linear features of the first patterned layer 170b are arranged in parallel along the second direction X and are separated from each other by a second pitch P2. According to an embodiment, the first pitch P1 and the second pitch P2 may be the same. It is noteworthy that the first patterned layer 170b in the peripheral region 102 may further include a segment feature that also extends along the first direction Y but has a relatively shorter length than the linear features.

Figure 2:
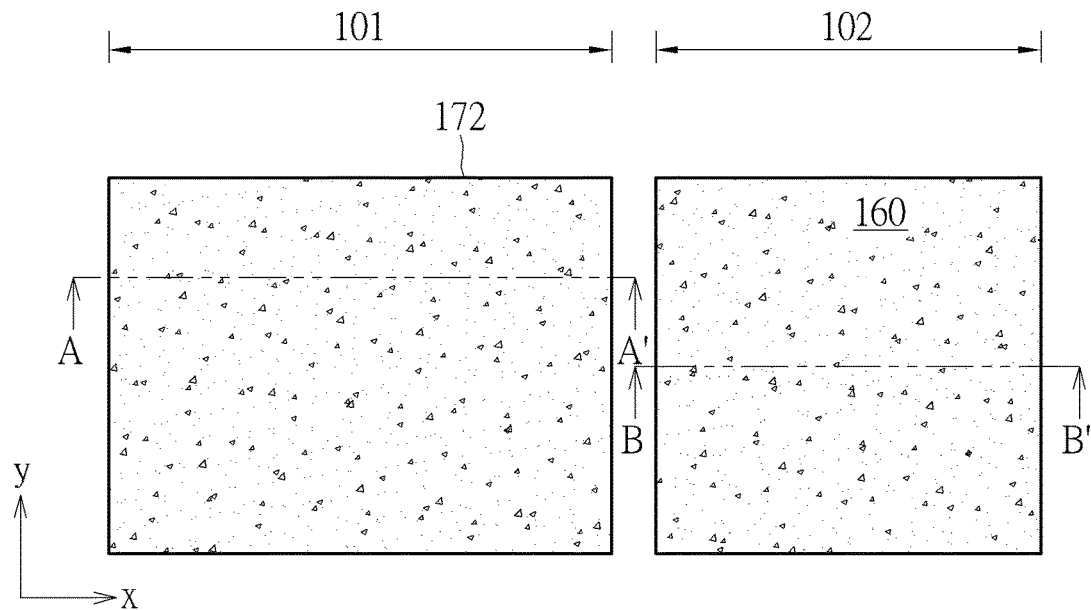
Figure 2:
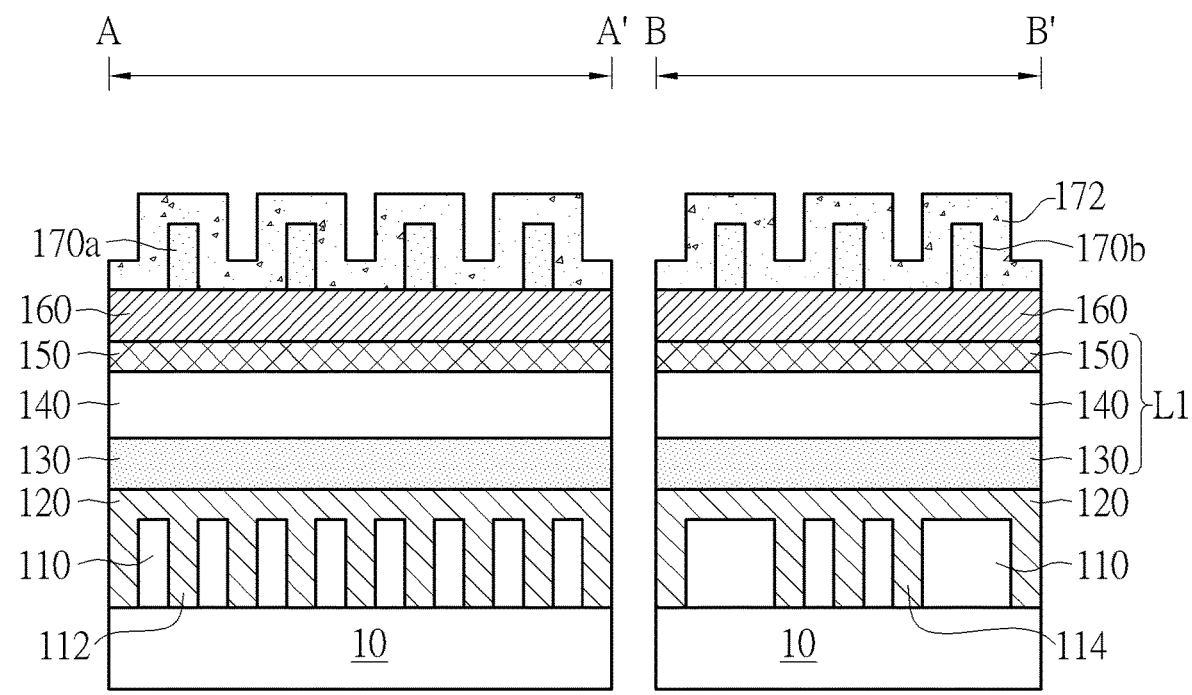
Figure 3:
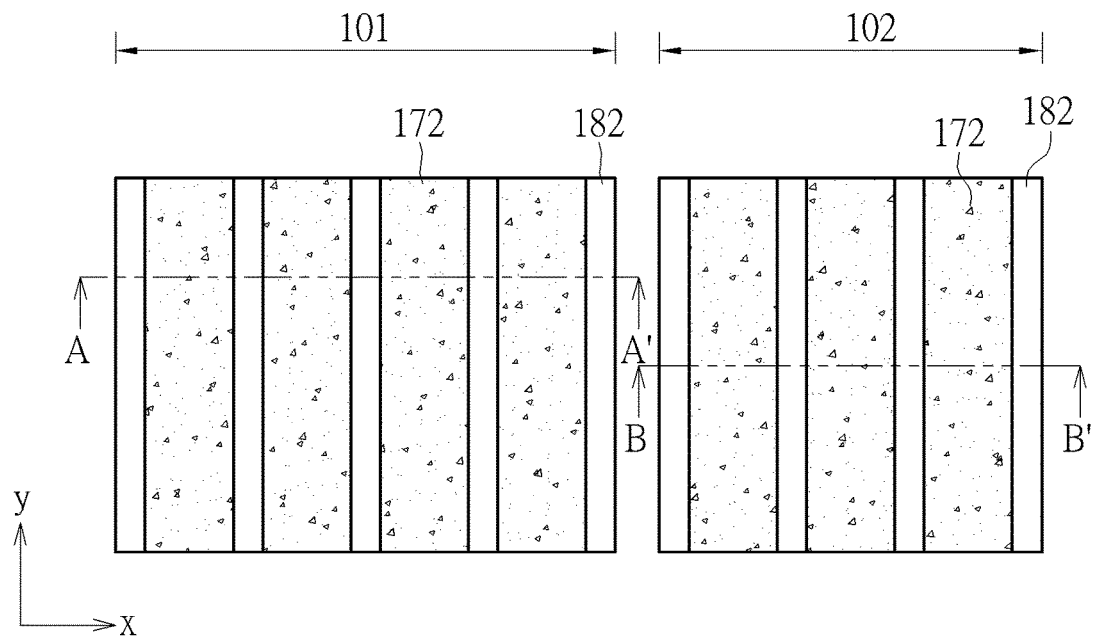
Figure 3:
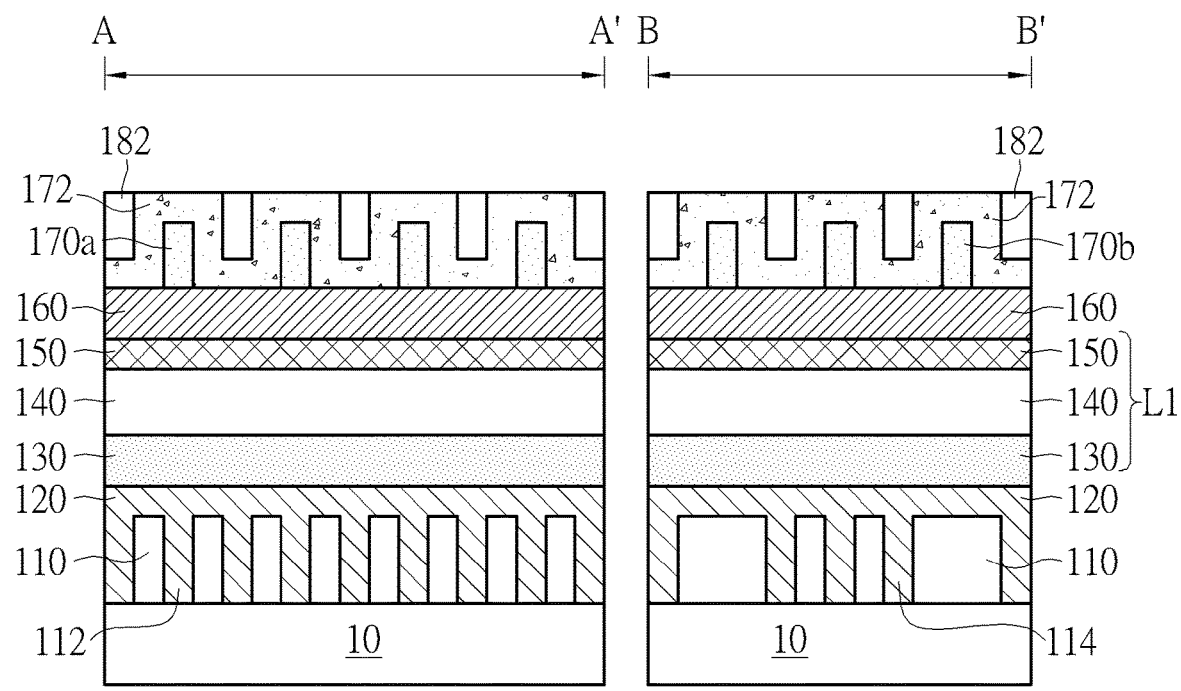
Figure 4:
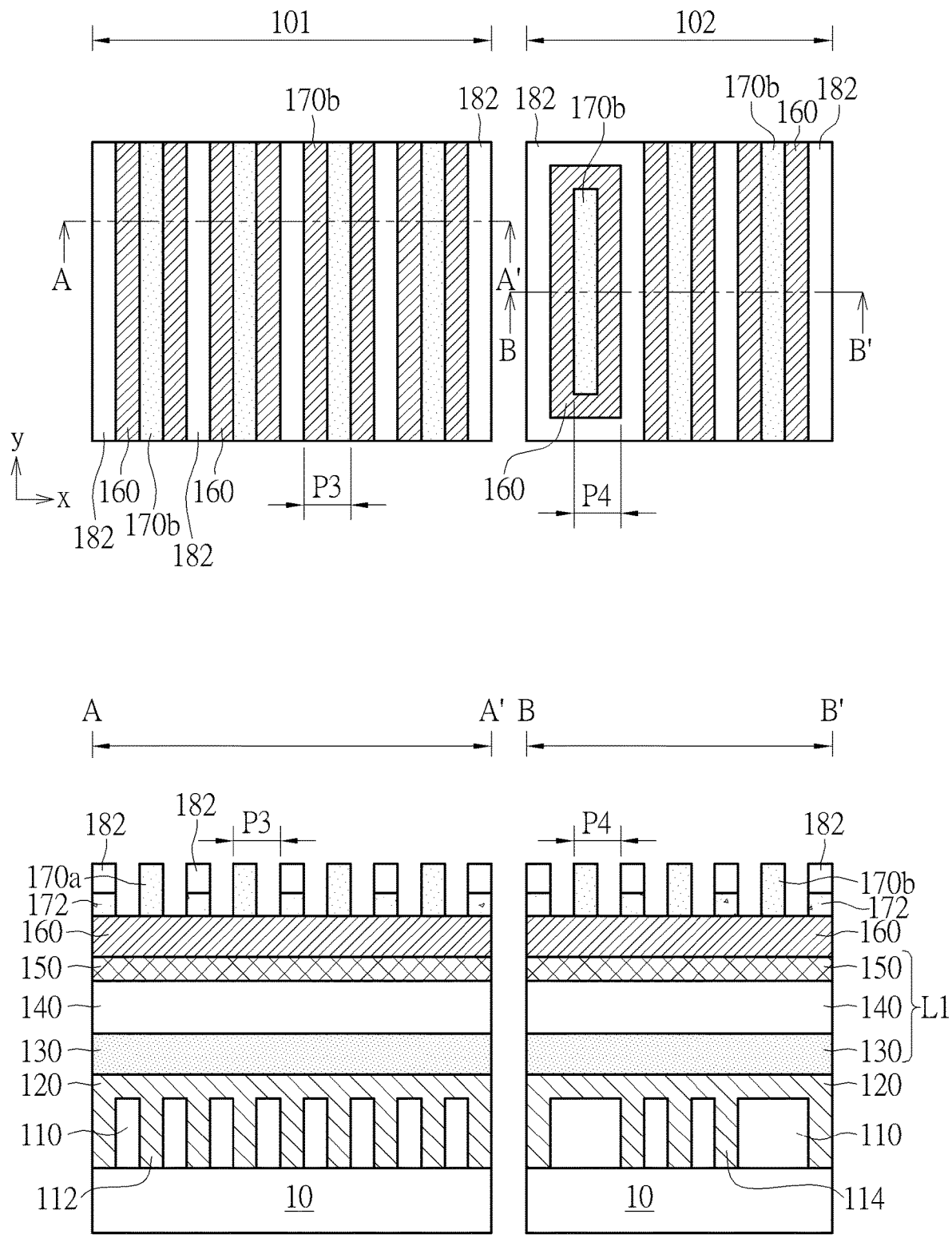
Figure 5:
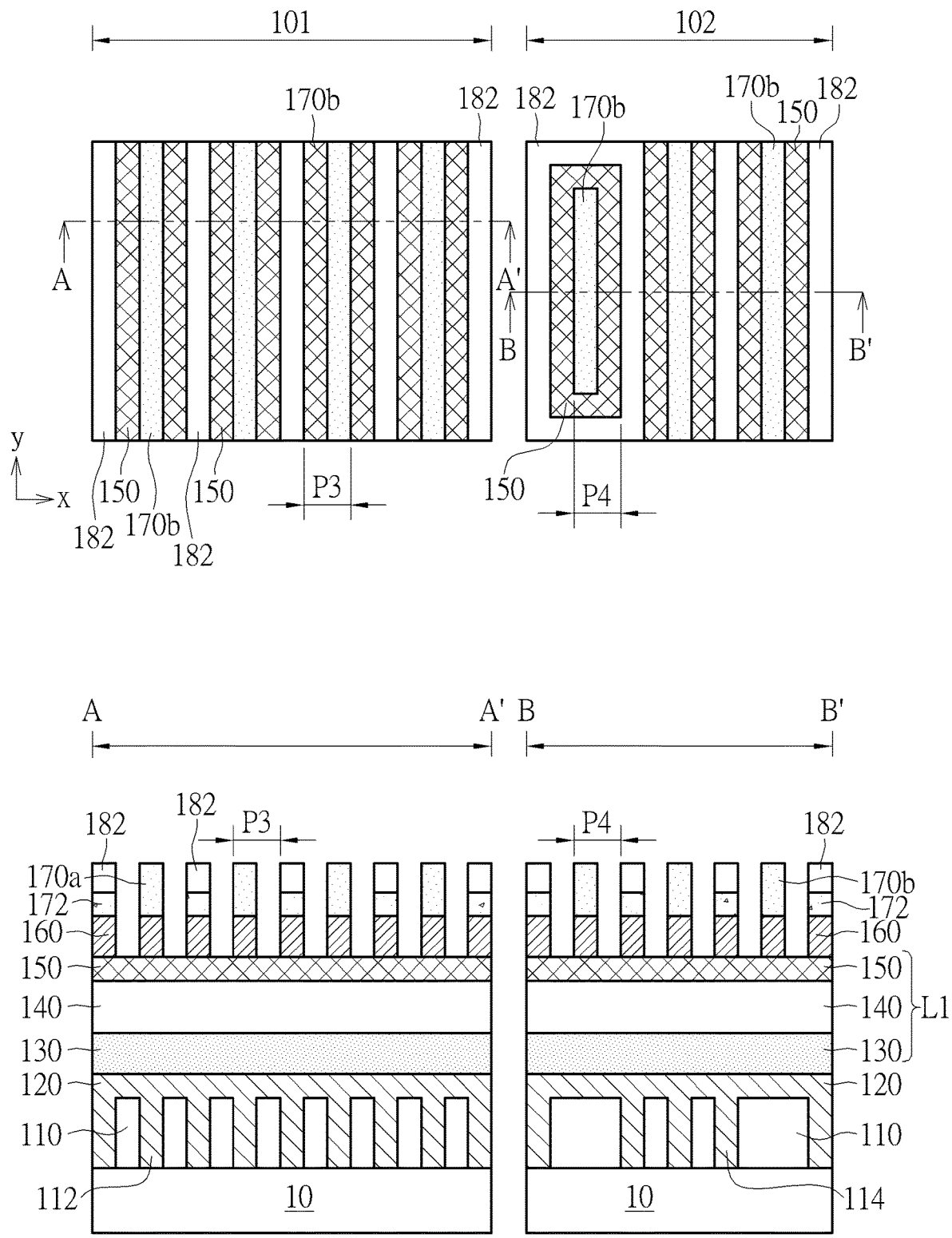
Figure 6:
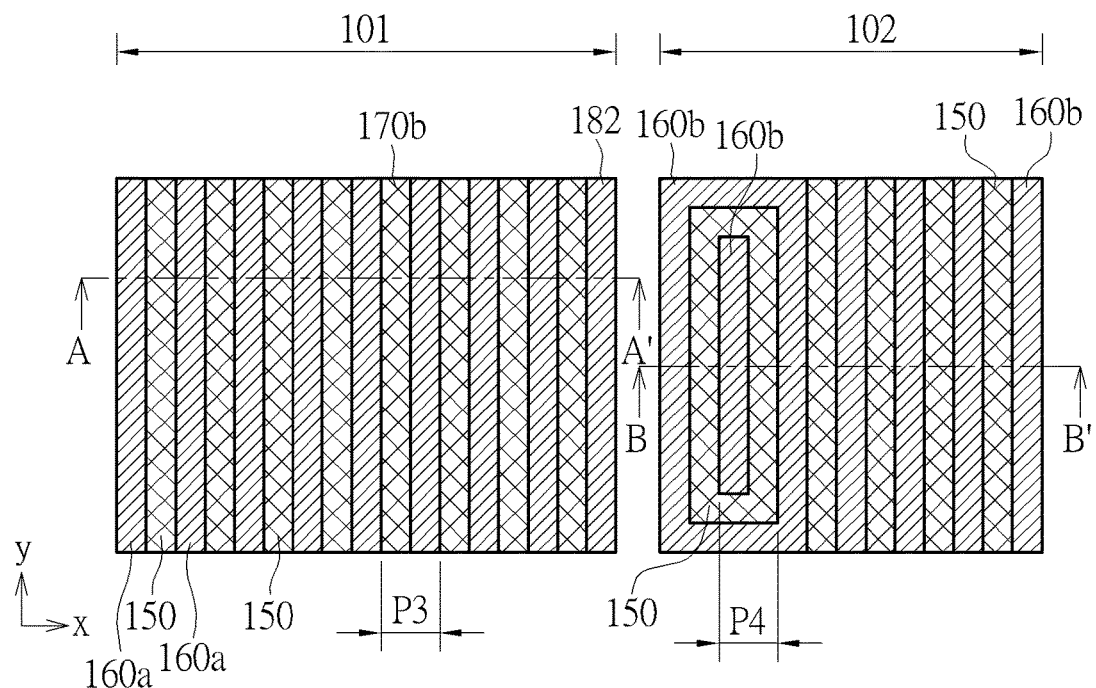
Figure 6:
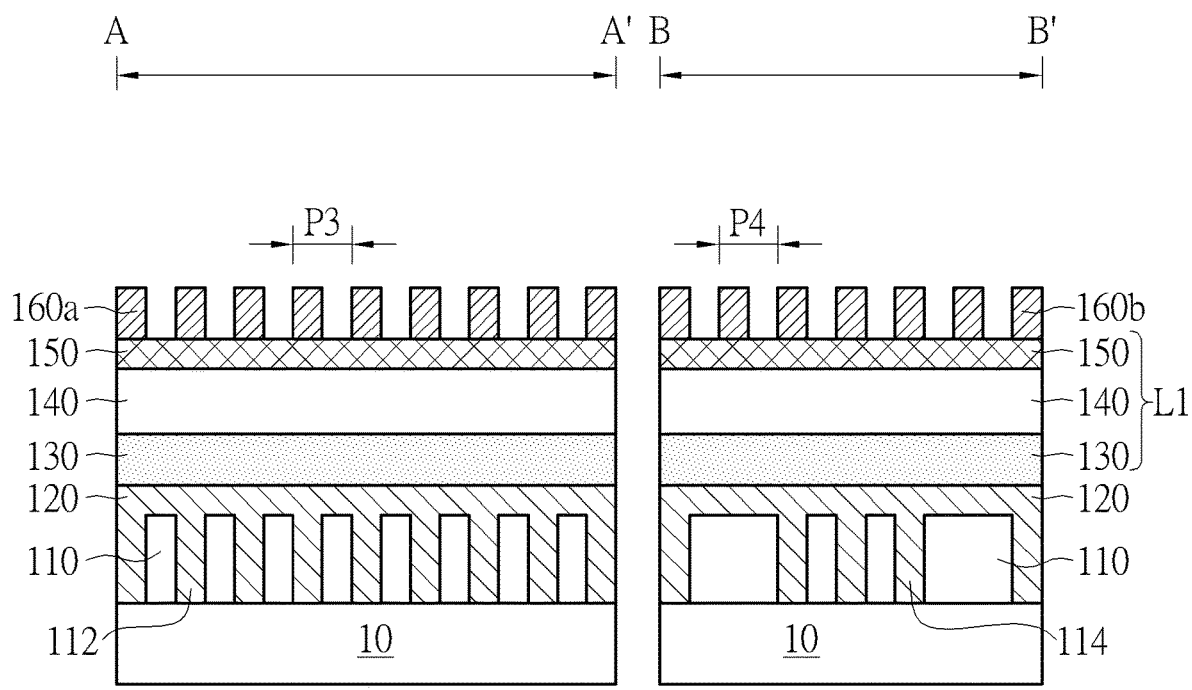

Please refer to FIG. 2 to FIG. 6, which illustrate the process of performing a first self-aligned double patterning (SADP) process based on the first patterned layer 170a/170b to simultaneously pattern the hard mask layer 160 in the array region 101 into a first array pattern 160a and pattern the hard mask layer 160 in the peripheral region 102 into a first peripheral pattern 160b. According to an embodiment, the first self-aligned double patterning (SADP) process may include the following steps. First, as shown in FIG. 2, a first spacer material layer 172 is formed on the substrate 10 in a blanket manner and conformally covers top surfaces and sidewalls of the linear features of the first patterned layer 170a/170b and the portion of the hard mask layer 160 exposed form the first patterned layer 170a/170b. After that, as shown in FIG. 3, a first planarization layer 182 is formed on the first spacer material layer 172 and filling up the spaces between the linear features of the first patterned layer 170a/170b. A planarization process or an etching back process is then performed to downwardly remove the first planarization layer 182 until the portions of the first spacer material layer 172 on the top surfaces and sidewalls of the linear features of the first patterned layer 170a/170b are exposed. At this stage, the spaces between the linear features of the first patterned layer 170a/170b are still filled by the remaining first planarization layer 182. Preferably, the exposed portions of the first spacer material layer 172 and the remaining first planarization layer 182 have flushed top surfaces. It is important that the first spacer material layer 172 is made of material having etching selectivity with respect to the first patterned layer 170a/170b and the first planarization layer 182. According to an embodiment, the first spacer material layer 172 may comprise silicon oxide, and the first planarization layer 182 may comprise a photoresist or an organic dielectric material. Following, as shown in FIG. 4, the exposed portions of the first spacer material layer 172 are removed to expose each of the linear features of the first patterned layer 170a/170b. The remaining first planarization layer 182 and the remaining first spacer material layer 172 under the remaining first planarization layer 182 become another set of linear features that are alternately arranged with the linear features of the first patterned layer 170a/170b. According to an embodiment, each linear feature of the first patterned layer 170a is spaced apart from neighboring linear features of remaining first planarization layer 182 by a third pitch P3, and P3 is half of the first pitch P1. Each linear feature of the first patterned layer 170b in the peripheral region 102 is spaced apart from neighboring linear features of the remaining first planarization layer 182 by a fourth pitch P4, and P4 is half of the second pitch P2. According to an embodiment when the first pitch P1 and the second pitch P2 are the same, the third pitch P3 and the fourth pitch P4 would be the same. After that, as shown in FIG. 5, an etching process is performed, using the first patterned layer 170a/170b and the remaining first planarization layer 182 as an etching mask to etch the hard mask layer 160 to pattern the hard mask layer 160 in the array region 101 into a first array pattern 160a and the hard mask layer 160 in the peripheral region 102 into a first peripheral pattern 160b. Following, as shown in FIG. 6, the remaining first patterned layer 170a/170b, the first spacer material layer 172 and the remaining first planarization layer 182 may be removed, exposing the first array pattern 160a and the first peripheral pattern 160b. According to the embodiment, the first array pattern 160a of the patterned hard mask layer 160 may comprise a plurality of linear features that extend along the first direction Y. The first peripheral pattern 160b of the patterned hard mask layer 160 may also comprise a plurality of linear features extending along the first direction Y. It is noticeable that the first peripheral pattern 160b may further comprise a closed-ring feature enclosing a segment feature formed by the first SADP process based on the line-shaped segment feature shown in FIG. 1. A portion of the anti-reflection layer 150 in the array region 101 and a portion of the anti-reflection layer 150 in the peripheral region 102 are exposed from the first array pattern 160a and the first peripheral pattern 160b, respectively.

Figure 7:
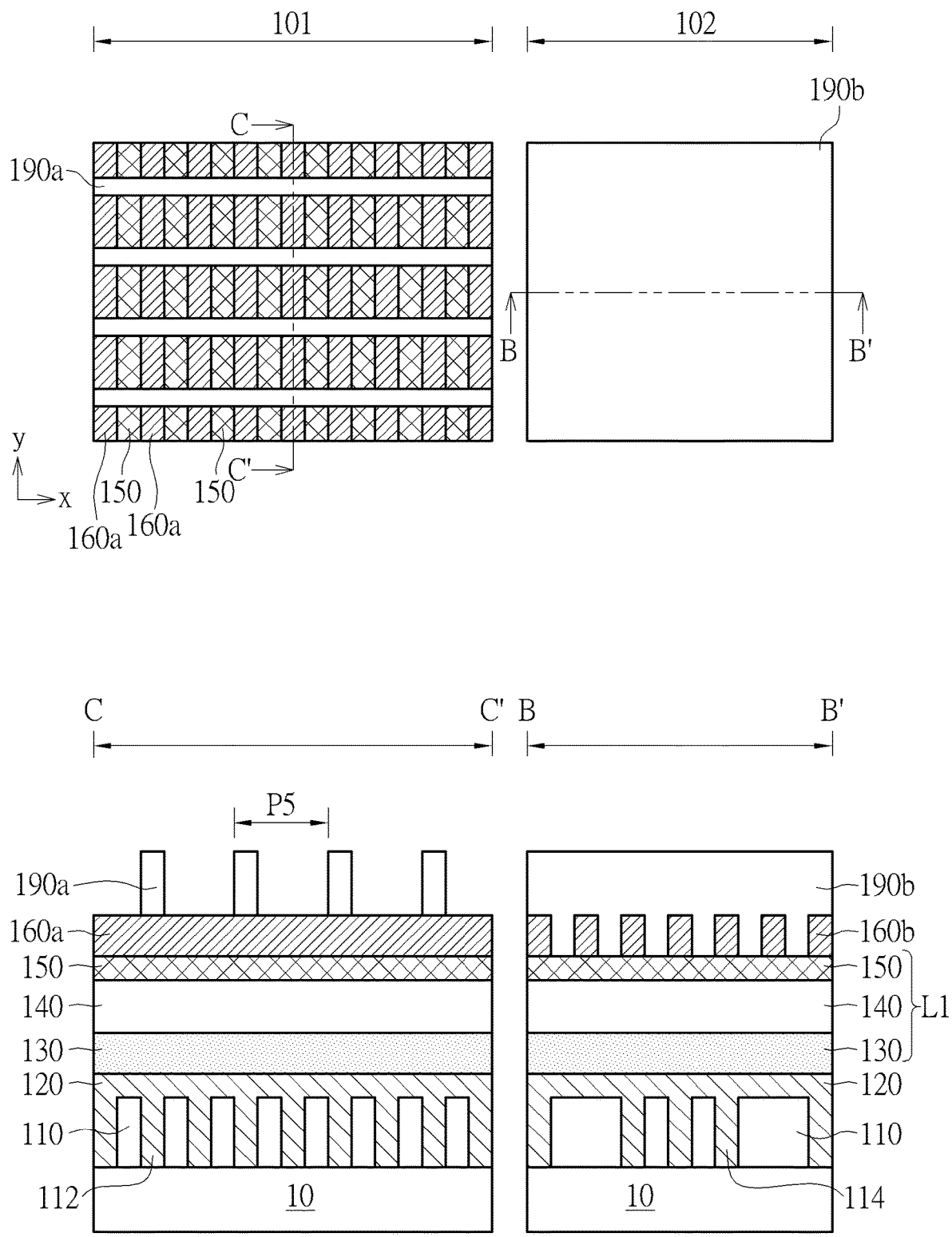

Please refer to FIG. 7. Subsequently, a second patterned layer 190a/190b, including a second patterned layer 190a in the array region 101 and second patterned layer 190b in the peripheral region 102, is formed on the substrate 10. The second patterned layer 190a comprises a plurality of linear features that extend along the second direction X and partially cover the first array pattern 160a and the anti-reflection layer 150 of the pattern transferring layer L1 in the array region 101. The second patterned layer 190b in the peripheral region 102 is a blank layer that completely covers the first peripheral pattern 160b, without exposing any portions of the first peripheral pattern 160b and the anti-reflection layer 150 in the peripheral region 102. The second patterned layer 190a/190b may comprise a photoresist or an organic dielectric material. The second patterned layer 190a/190b may be formed by forming an organic dielectric layer (or a photoresist layer) on the substrate 10 and then performing an patterning process, such as a photolithography-etching process to pattern the organic dielectric layer in the array region 101 into the second patterned layer 190a, without forming any pattern in the organic dielectric layer in the peripheral region 102 thereby obtaining the blank second patterned layer 190b. According to an embodiment, the linear features of the second patterned layer 190a in the array region 101 may be spaced apart from each other by a fifth pitch P5.

Figure 8:
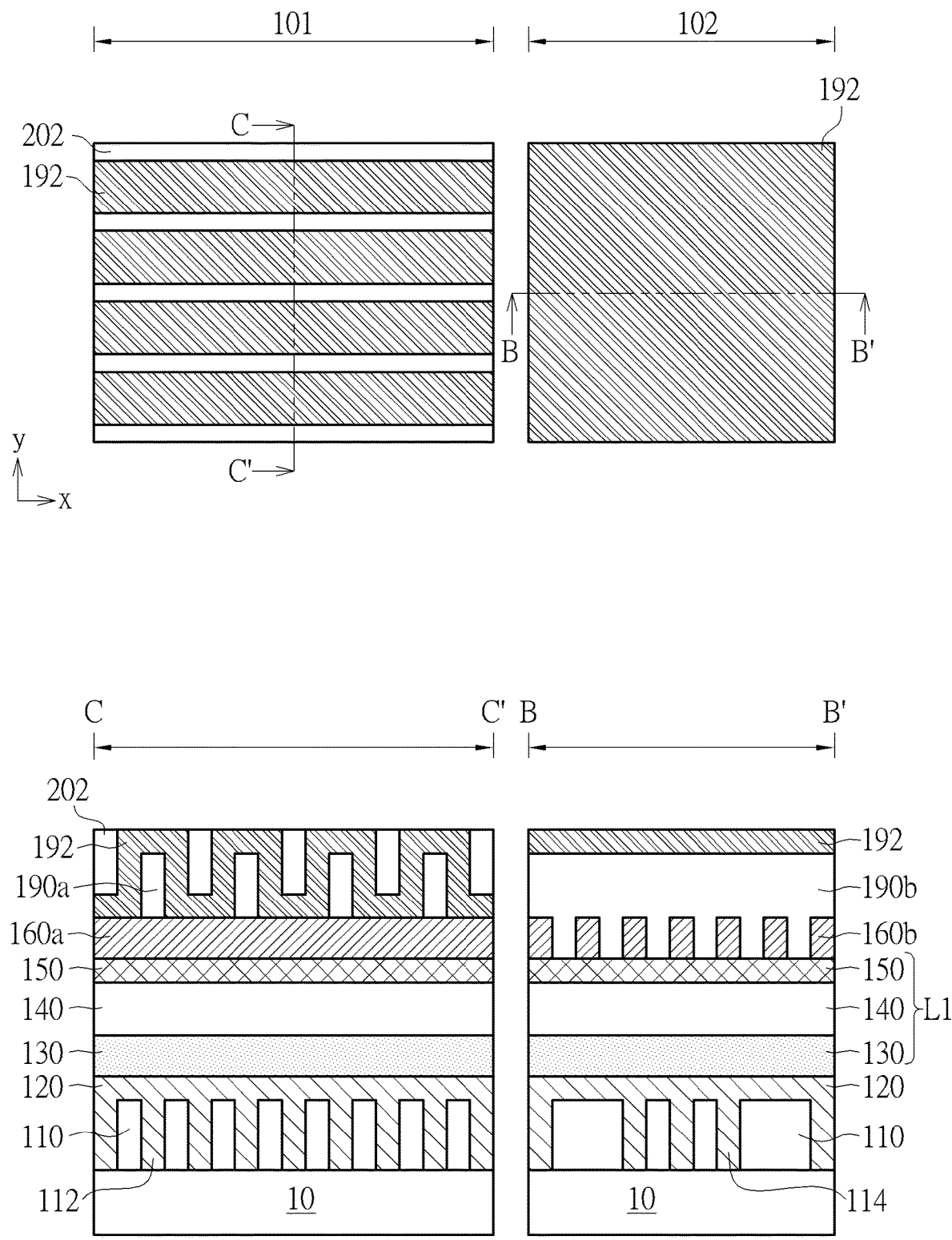

Please refer to FIG. 8 to FIG. 11, which illustrates the process of performing a second self-aligned double patterning (SADP) process based on the second patterned layer 190a/190b to pattern the first array pattern 160a into a second array pattern 160a'. Similarly, the second self-aligned double patterning (SADP) process may include the following steps. First, as shown in FIG. 8, a second spacer material layer 192 is formed on the substrate 10 and conformally covers the top surfaces and sidewalls of the linear features of the second patterned layer 190a in the array region 101 and also covers the top surface of the second patterned layer 190b in the peripheral region 102. After that, a second planarization layer 202 is formed covering on the second spacer material layer 192 in the array region 101 and in the peripheral region 102 and fills up the spaces between the linear features of the second patterned layer 190a. A planarization process or an etching back process is then performed to downwardly remove the second planarization layer 202 until portions of the second spacer material layer 192 on the top surfaces and sidewalls of the linear features of the second patterned layer 190a are exposed. The spaces between the linear features of the second patterned layer 190a are still filled by the remaining second planarization layer 202. It is important that, at this stage, the second planarization layer 202 covering on the second spacer material layer 192 in the peripheral region 102 has to be completely removed to completely expose the second spacer material layer 192 on the top surface of the second patterned layer 190b to avoid any of the second spacer material layer 192 on the top surface of the second patterned layer 190b being masked during a later etching process. Preferably, the exposed portion of the second spacer material layer 192 and the remaining second planarization layer 202 have flushed top surfaces. According to an embodiment, the second spacer material layer 192 may comprise silicon oxide, and the second planarization layer 202 may comprise a photoresist material or an organic dielectric material.

Figure 9:
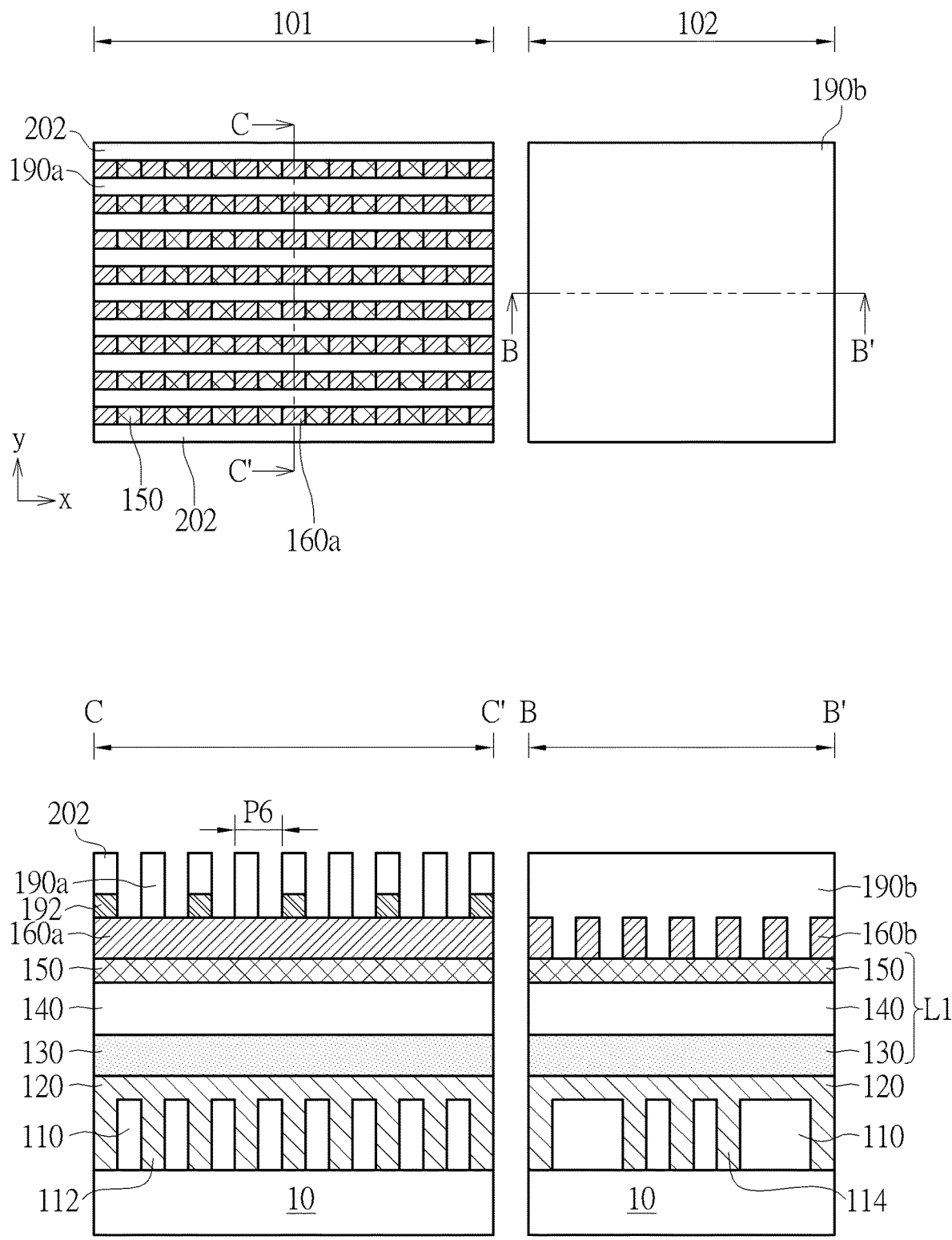

Subsequently, as shown in FIG. 9, the exposed portions of the second spacer material layer 192 are removed to expose each of the linear features of the second patterned layer 190a. The remaining second planarization layer 202 and the remaining second spacer material layer 192 under the remaining second planarization layer 202 become another set of liner features that are alternately arranged with the linear features of the second patterned layer 190a. As shown in the top view of FIG. 9, a portion of the first array pattern 160a and a portion of the anti-reflection layer 150 are exposed from the second patterned layer 190a and the remaining second planarization layer 202. According to an embodiment, each linear feature of the second patterned layer 190a is spaced apart from neighboring linear features of remaining second planarization layer 202 by a sixth pitch P6, and P6 is half of the fifth pitch P5. The first peripheral pattern 160b and the anti-reflection layer 150 of the pattern transferring layer L1 in the peripheral region 102 are still completely covered by the second patterned layer 190b. It is noticeable that, at this stage, the second spacer material layer 192 in the peripheral region 102 has to be completely removed to prevent pattern deformation due to residue of second spacer material layer 192 in the peripheral region 102.

Figure 10:
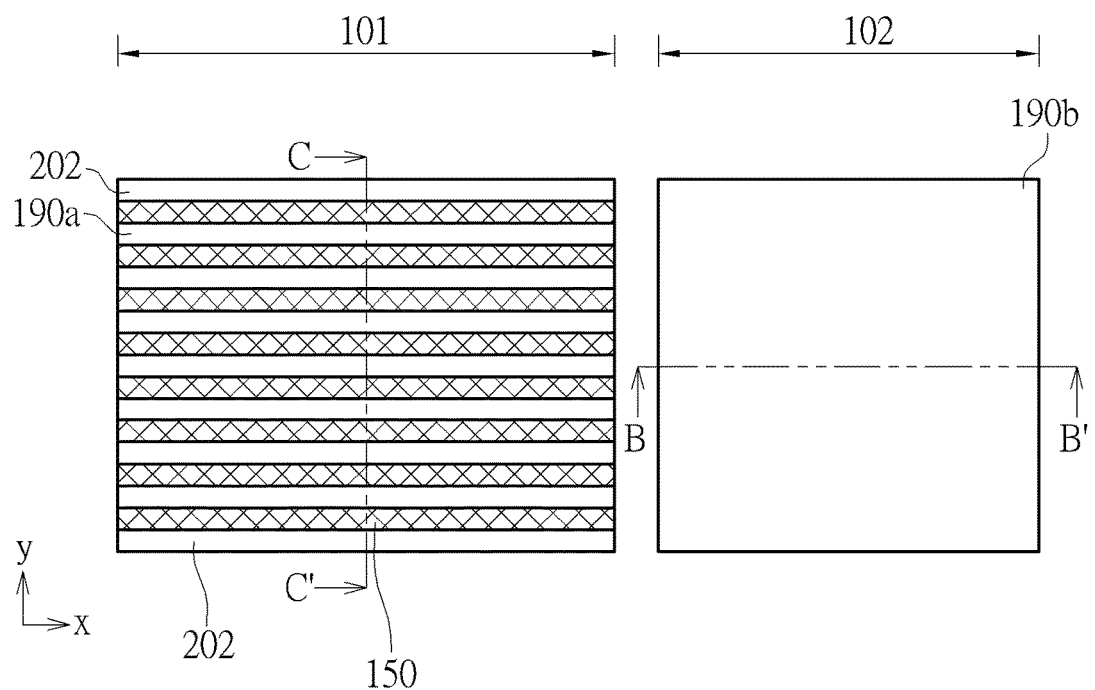
Figure 10:
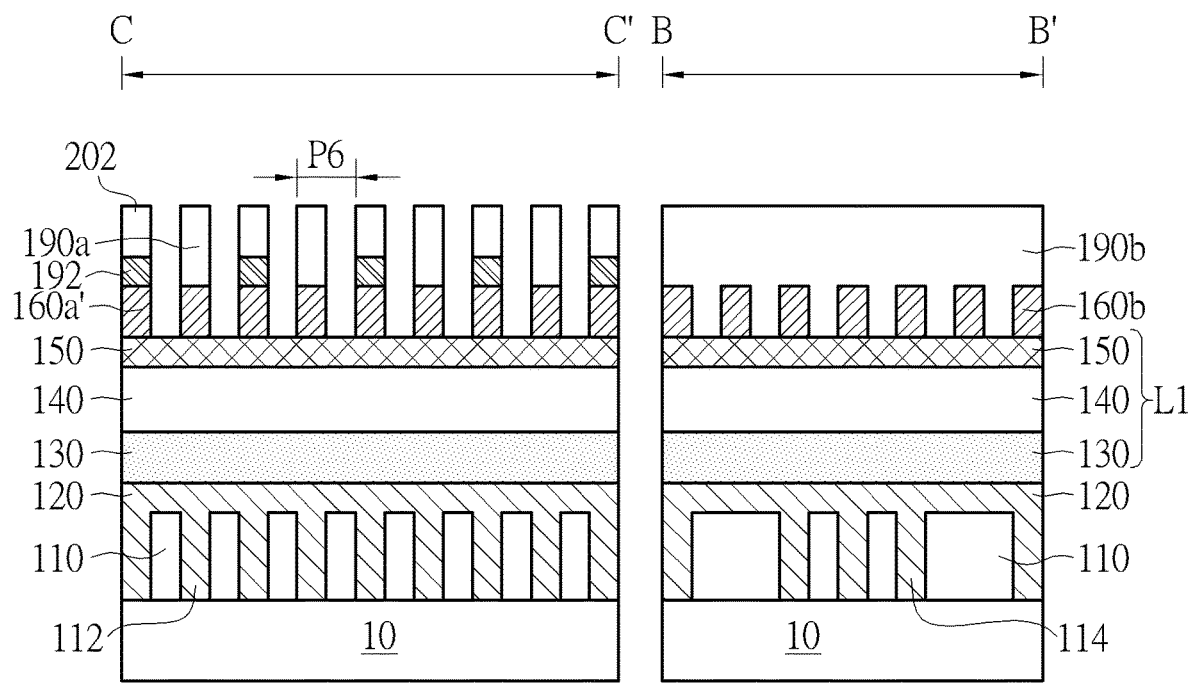
Figure 11:
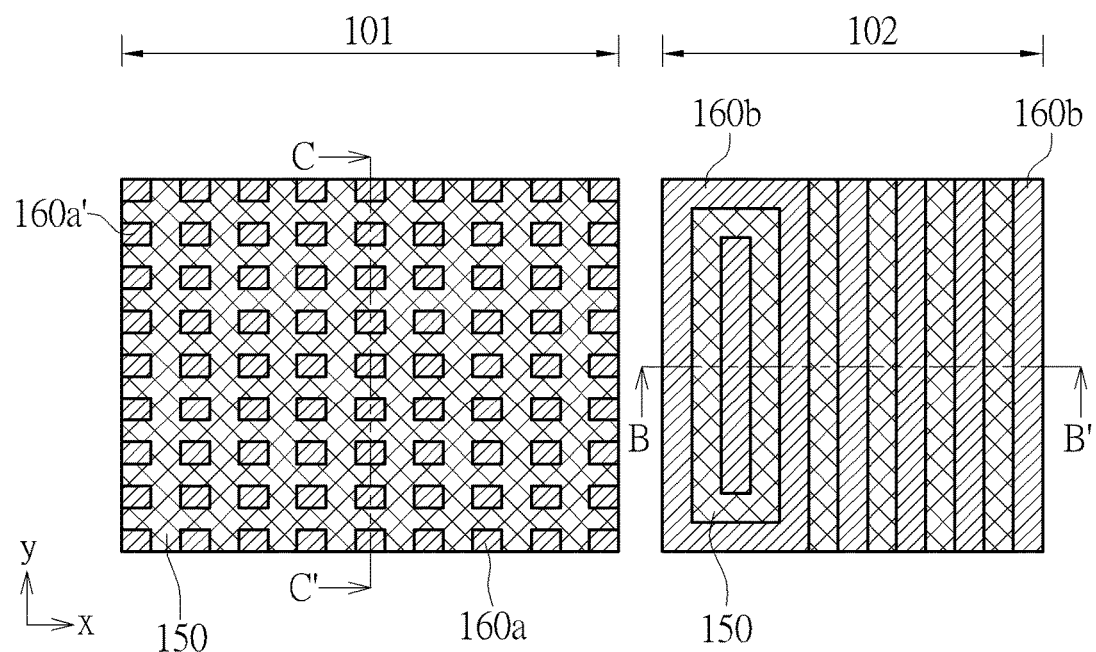
Figure 11:
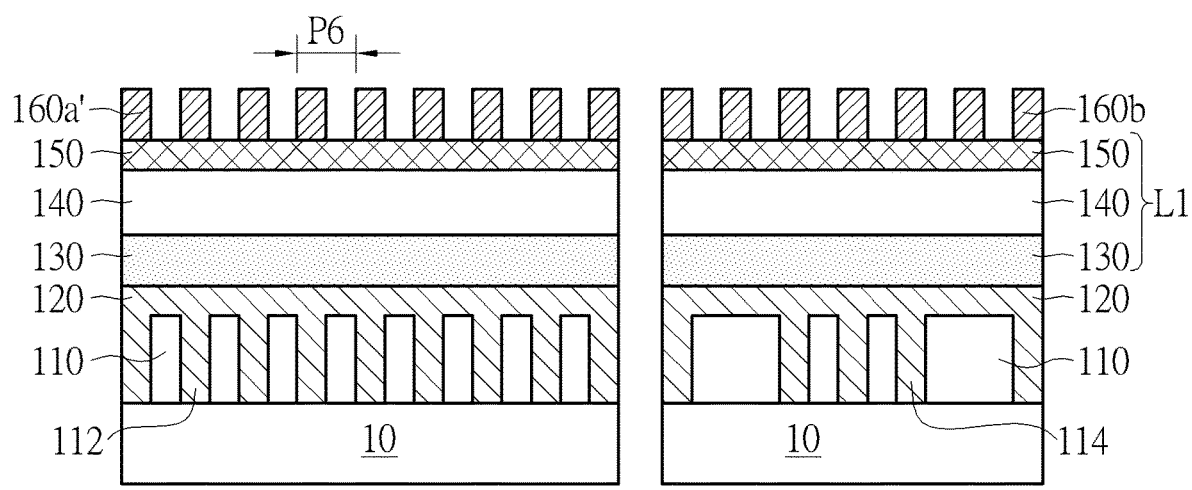

Subsequently, as shown in FIG. 10, an etching process is performed, using the second patterned layer 190a and the remaining second planarization layer 202 as an etching mask to etch the exposed portion of the first array pattern 160a, thereby patterning the first array pattern 160a in the array region 101 into a second array pattern 160a'. The first peripheral pattern 160b in the peripheral region 102 is protected by the second patterned layer 190b from being etched. Following, as shown in FIG. 11, the remaining second patterned layer 190a/190b, the second spacer material layer 192 and the and second planarization layer 202 may be removed to expose the second array pattern 160a' and the first peripheral pattern 160b. As shown in the top view of FIG. 11, the second array pattern 160a' may comprise a plurality of island-shaped features which are arranged into an array along the first direction Y and the second direction X. According to an embodiment, the island-shaped features of the second array pattern 160a' may have a same length along the first direction Y and a same width along the second direction X.

Figure 12:
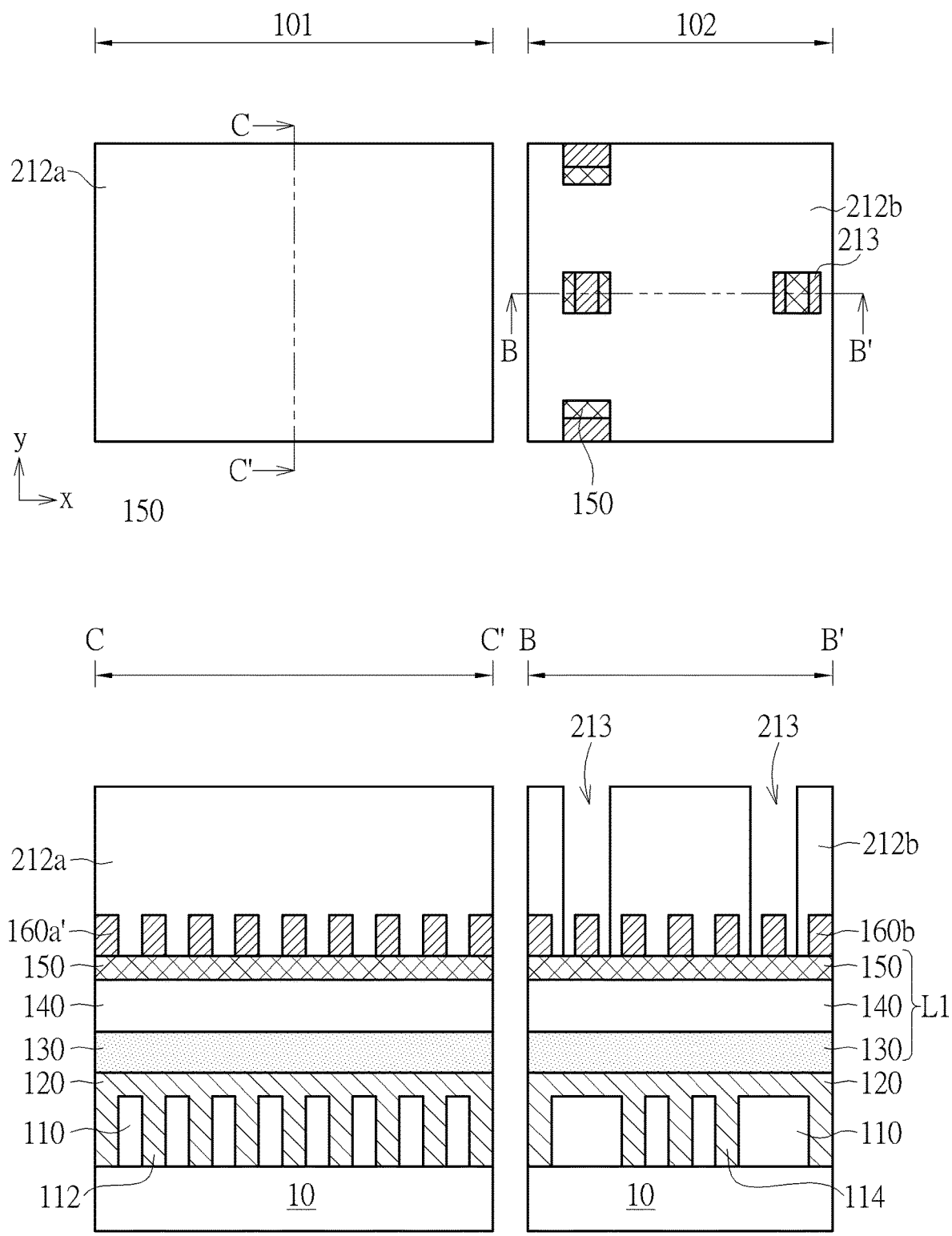

Please refer to FIG. 12. Subsequently, a third patterned layer 212a/212b, including the third patterned layer 212a in the array region 101 and the third patterned layer 212b in the peripheral region 102, is formed on the substrate 10. The third patterned layer 212a in the array region 101 is a blank layer that completely covers the second array pattern 160a' in the array region 101. The third patterned layer 212b in the peripheral region 102 has a plurality of openings 213 to expose predetermined portions of the first peripheral pattern 160b in the peripheral region 102. For example, the openings 213 of the third patterned layer 212b may expose portions of the closed-ring feature and portions of the linear features of the first peripheral pattern 160b that are to be removed to cut the closed-ring feature and the linear features into segments. The third patterned layer 212a/212b may comprise a photoresist material or an organic dielectric material. The third patterned layer 212a/212b may be formed by, for example, forming an organic dielectric layer (or a photoresist layer) on the substrate 10 and then performing an patterning process, such as a photolithography-etching process to pattern the organic dielectric layer in the peripheral region 102 into the third patterned layer 212b, without forming any pattern in the organic dielectric layer in the array region 101 thereby obtaining the blank third patterned layer 212a.

Figure 13:
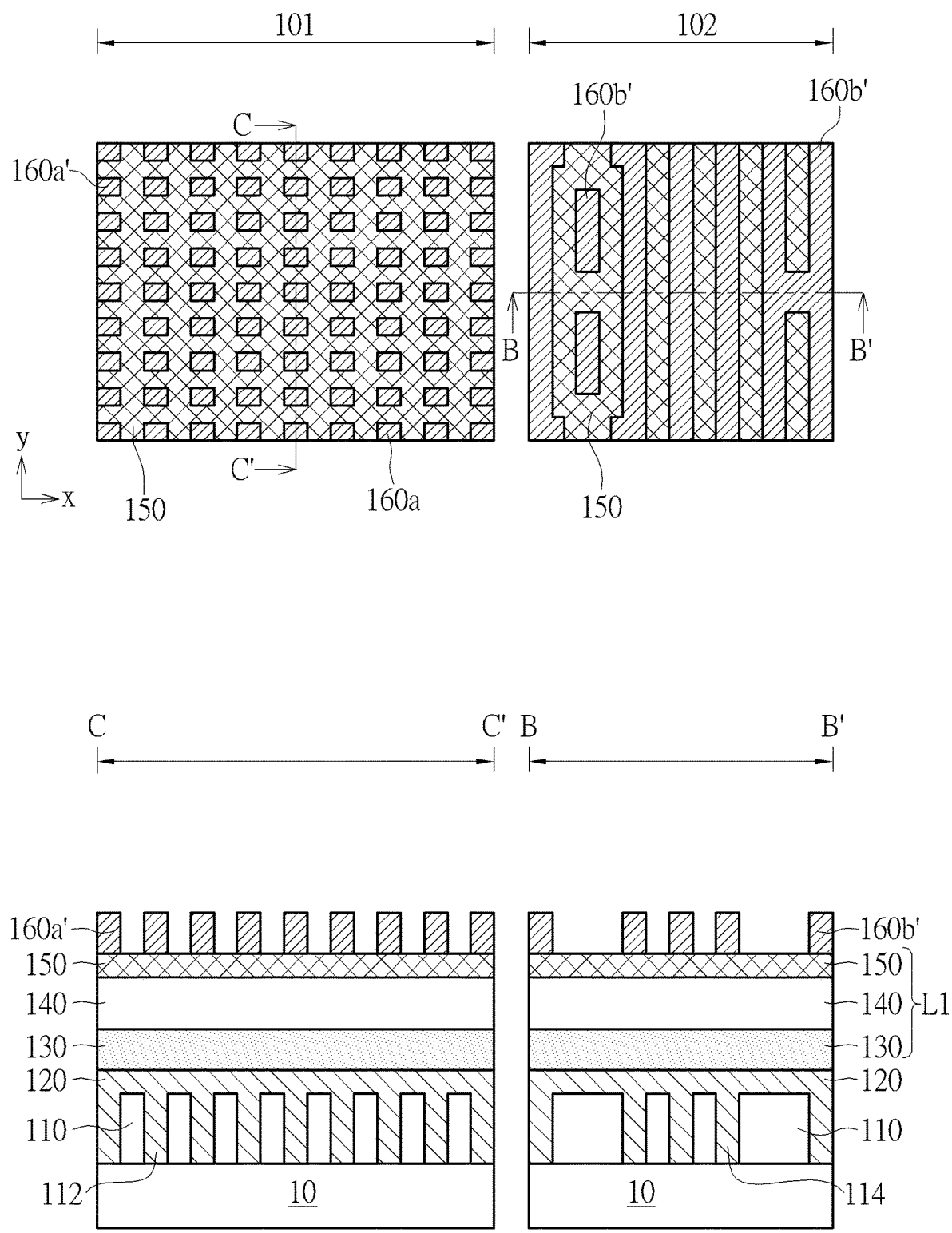

Please refer to FIG. 13. Subsequently, by using the third patterned layer 212a/212b as an etching mask, an etching process is performed to etching the exposed portions of the first peripheral pattern 160b through the openings 213 thereby patterning the first peripheral pattern 160b into the second peripheral pattern 160b'. After that, the third patterned layer 212a/212b may be removed to expose the second array pattern 160a' and the second peripheral pattern 160b'. As shown in the top view of FIG. 13, the second peripheral pattern 160b' may include at least an open-ring feature formed by removing portions of the closed-ring feature of the first peripheral pattern 160b as shown in FIG. 6. Furthermore, the second peripheral pattern 160b' may further include a plurality of segment features having different lengths formed by removing portions of the linear features or segment features previously shown in the first peripheral pattern 160b as shown in FIG. 6.

Figure 14:
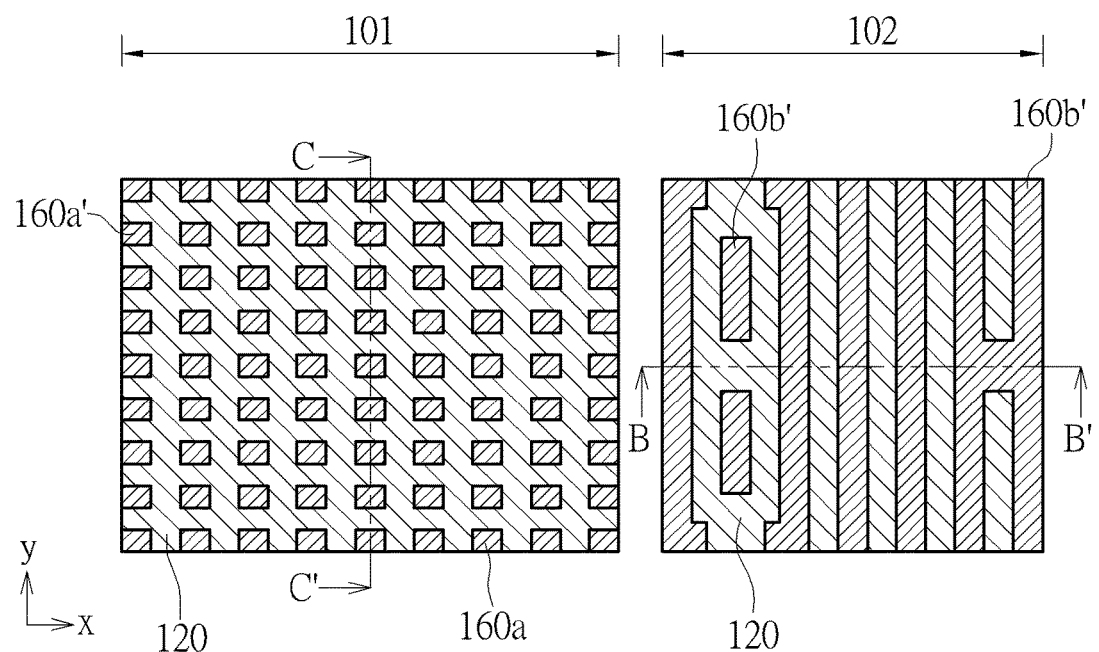
Figure 14:
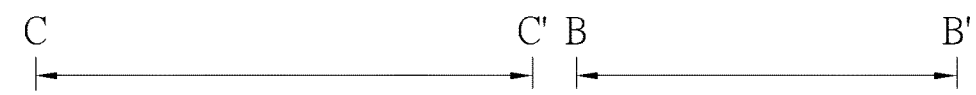
Figure 14:
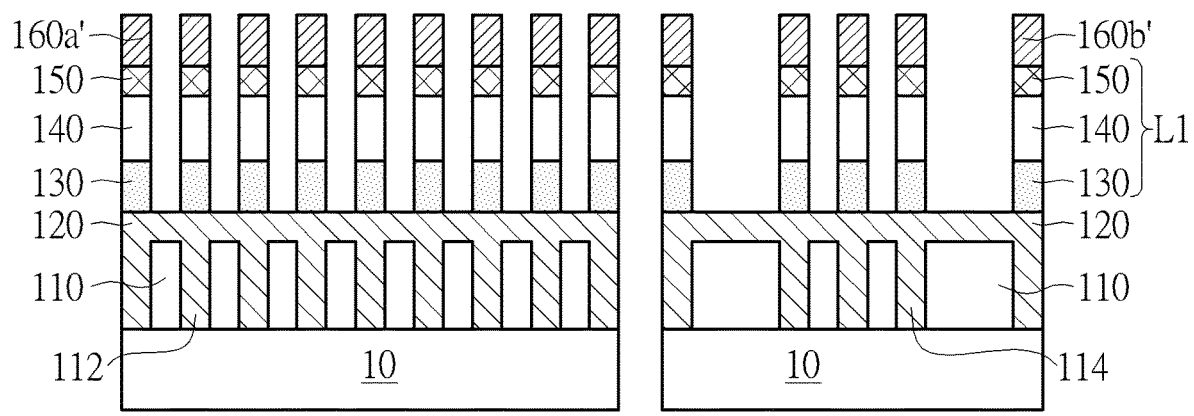

Please refer to FIG. 14. Afterward, by using the second array pattern 160a' and the second peripheral pattern 160b' as an etching mask, an etching process is performed to etch the stacked films of the pattern transferring layer L1 thereby transferring the patterns of the second array pattern 160a' and the second peripheral pattern 160b' downwardly into the pattern transferring layer L1 at the same time to expose portions of the target layer 120 in the array region 101 and in the peripheral region 102 that are to be removed by a later etching process.

Figure 15:
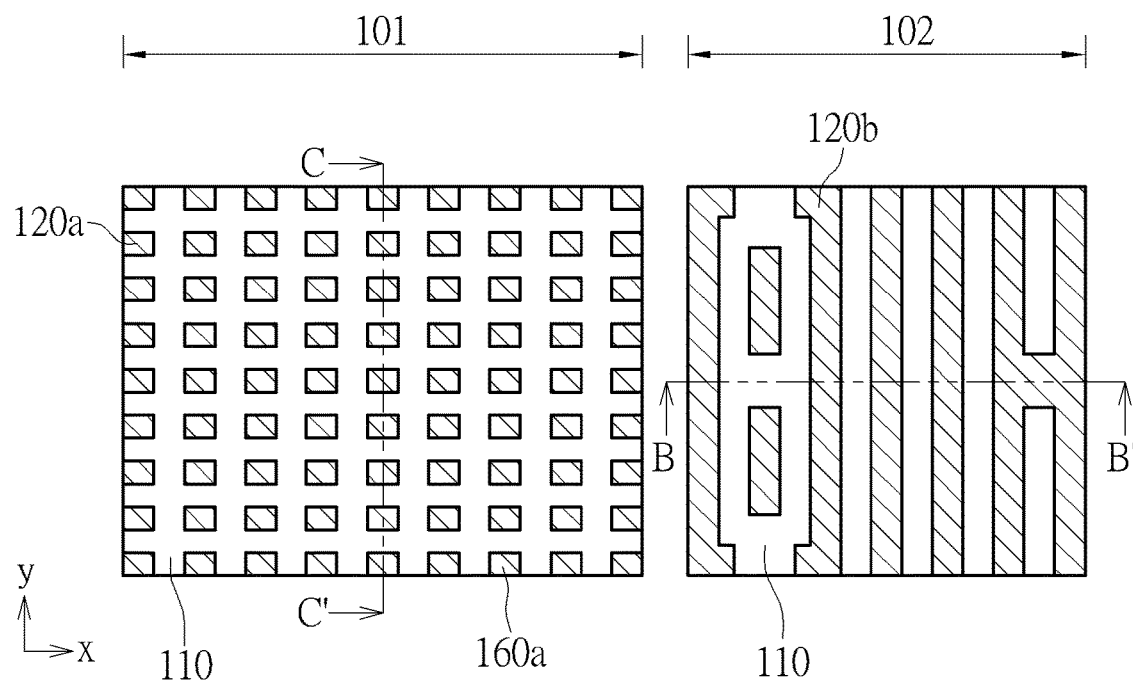

Please refer to FIG. 15. Following, by using the patterned pattern transferring layer L1 as an etching mask, another etching process is performed to etch the exposed portions of the target layer 120, thereby transferring the patterns of the second array pattern 160a' and the second peripheral pattern 160b' simultaneously from the patterned pattern transferring layer L1 downwardly into the target layer 120 to form a target pattern 120a in the array region 101 and a target pattern 120b in the peripheral region 102. As shown in the top view of FIG. 15, the target pattern 120a may comprise a plurality of array-arranged island-shaped features that function as storage node contact (SNC) pads used to electrically connect the contact plugs 112 and capacitors (not shown). The target pattern 120b may comprise linear features, segment features and open-ring features that function as the contact plug pads (also referred to as M0 contact) used to electrically connect the contact plugs 114 and upper metal interconnections (not shown). By using the method provided by the present invention, the target patterns 120a and 120b comprising different type of dense patterns may be formed with simplified process steps and improved fidelity and manufacturability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A patterning method for forming a semiconductor device, comprising:
providing a substrate comprising an array region and a peripheral region defined thereon;
forming a hard mask layer on the substrate and covering the array region and the peripheral region;
forming a first patterned layer on the hard mask layer;
performing a first self-aligned double patterning process based on the first patterned layer to pattern the hard mask layer in the array region into a first array pattern and the hard mask layer in the peripheral region into a first peripheral pattern;
forming a second patterned layer on the substrate, partially covering the first array pattern and completely covering the first peripheral pattern;
performing a second self-aligned double patterning process based on the second patterned layer to pattern the first array pattern into a second array pattern;
forming a third patterned layer on the substrate, partially covering the first peripheral pattern and completely covering the second array pattern; and
performing an etching process using the third patterned layer as an etching mask to etch the first peripheral pattern thereby patterning the first peripheral pattern into a second peripheral pattern.

2. The method according to claim 1, wherein the first pattered layer comprises a plurality of linear features that are straight-line shaped and extend along a first direction, and the second patterned layer comprises a plurality of linear features that are straight-line shaped and extend along a second direction.

3. The method according to claim 2, wherein the first direction and the second direction are perpendicular.

4. The method according to claim 2, wherein the first direction and the second direction define an included angle smaller than 90 degrees.

5. The method according to claim 1, wherein the first peripheral pattern comprises a closed-ring feature enclosing a segment feature.

6. The method according to claim 5, wherein portions of the closed-ring feature and the segment feature are exposed from the third patterned layer.

7. The method according to claim 1, wherein the second array pattern comprises a plurality of island-shaped features and the second peripheral pattern comprises a plurality of segment features having different lengths.

8. The method according to claim 1, wherein the first self-aligned double patterning process comprises:
forming a first spacer material layer on the substrate and conformally covering a plurality of linear features of the first patterned layer;
forming a first planarization layer on the first spacer material layer and filling up spaces between the linear features of the first patterned layer;
removing the first planarization layer until exposing a portion of the first spacer material layer, wherein the spaces between the linear features of the first patterned layer are still filled by a remaining portion of the first planarization layer;
removing the exposed portion of the first spacer material layer to expose the first patterned layer and a portion of the hard mask layer;
performing an etching process, using the first patterned layer and the remaining portion of the first planarization layer as an etching mask to etch the hard mask layer thereby patterning the hard mask layer into the first array pattern and the first peripheral pattern; and
removing the first patterned layer and the first planarization layer.

9. The method according to claim 8, wherein the first pattered layer and the first planarization layer respectively comprise a photoresist or an organic dielectric material.

10. The method according to claim 8, wherein the first spacer material layer comprise silicon oxide.

11. The method according to claim 1, wherein second self-aligned double patterning process comprises:

forming a second spacer material layer on the substrate and conformally covering a plurality of linear features of the second patterned layer;

forming a second planarization layer on the second spacer material layer and filling up spaces between the linear features of the second patterned layer;

removing the second planarization layer until exposing a portion of the second spacer material layer, wherein the spaces between the linear features of the second patterned layer are still filled by a remaining portion of the second planarization layer;

removing the exposed portion of the second spacer material layer to expose the second patterned layer and a portion of the first array pattern;

performing an etching process using the second patterned layer and the remained portion of the second planarization layer as an etching mask to etch the first array pattern thereby patterning the first array pattern into the second array pattern; and removing the second patterned layer and the second planarization layer.

12. The method according to claim 11, wherein the second pattered layer and the second planarization layer respectively comprise a photoresist or an organic dielectric material.

13. The method according to claim 11, wherein the second spacer material layer comprises silicon oxide.

14. The method according to claim 1, wherein the hard mask layer comprises silicon nitride or polysilicon.

15. The method according to claim 1, wherein the third patterned layer comprises a photoresist or an organic dielectric material.

16. The method according to claim 1, further comprising:
forming a pattern transferring layer between the substrate and the hard mask layer; and
after removing the third patterned layer, etching the pattern transferring layer by using the second array pattern and the second peripheral pattern as an etching mask to pattern the pattern transferring layer.

17. The method according to claim 16, further comprising:
forming a target layer between the pattern transferring layer and the substrate; and
after patterning the pattern transferring layer, using the pattern transferring layer as an etching mask to etch the target pattern.

18. The method according to claim 17, wherein the target layer comprises conductive material.

* * * * *

UNITED STATES PATENT AND TRADEMARK OFFICE
CERTIFICATE OF CORRECTION

PATENT NO. : 10,535,530 B2
APPLICATION NO. : 16/167435
DATED : January 14, 2020
INVENTOR(S) : Feng-Yi Chang et al.

Page 1 of 1

It is certified that error appears in the above-identified patent and that said Letters Patent is hereby corrected as shown below:

On the Title Page

Item (73), correct the address of the 2nd assignee from "Quanzhou, Fujinan Province (CN)" to --Quanzhou, Fujian Province (CN)--.

Signed and Sealed this
Twenty-fourth Day of March, 2020

Andrei Iancu
*Director of the United States Patent and Trademark Office*